US011567150B2

(12) United States Patent
Kocaturk et al.

(10) Patent No.: US 11,567,150 B2
(45) Date of Patent: Jan. 31, 2023

(54) MRI-COMPATIBLE DEVICES

(71) Applicant: Transmural Systems LLC, Andover, MA (US)

(72) Inventors: Ozgur Kocaturk, Rockville, MD (US); Nasser Rafiee, Andover, MA (US)

(73) Assignee: Transmural Systems LLC, Andover, MA (US)

( * ) Notice: Subject to any disclaimer, the term of this patent is extended or adjusted under 35 U.S.C. 154(b) by 0 days.

(21) Appl. No.: 17/238,897

(22) Filed: Apr. 23, 2021

(65) Prior Publication Data

US 2021/0247473 A1 Aug. 12, 2021

Related U.S. Application Data

(63) Continuation-in-part of application No. 17/234,608, filed on Apr. 19, 2021, which is a continuation-in-part of application No. PCT/US2019/057297, filed on Oct. 21, 2019, and a continuation-in-part of application No. PCT/US2021/028725, filed on Apr. 22, 2021, which is a continuation-in-part of application No. 17/234,608, filed on Apr. 19, 2021.

(60) Provisional application No. 63/013,977, filed on Apr. 22, 2020, provisional application No. 63/170,682, filed on Apr. 5, 2021, provisional application No. 62/748,026, filed on Oct. 19, 2018.

(51) Int. Cl.
*G01R 33/28* (2006.01)
*G01R 33/36* (2006.01)

(52) U.S. Cl.
CPC ........ *G01R 33/287* (2013.01); *G01R 33/36* (2013.01)

(58) Field of Classification Search
CPC .... G01R 33/287; G01R 33/36; G01R 33/285; G01R 33/34084; G01R 33/34007; A61F 2/966; A61F 2002/826; A61B 34/20
See application file for complete search history.

(56) References Cited

U.S. PATENT DOCUMENTS 6,171,240 B1 1/2001 Young et al.
6,332,089 B1 12/2001 Acker et al.
(Continued)

FOREIGN PATENT DOCUMENTS

WO 2017048759 A1 3/2017
WO 2020/082091 A1 4/2020

OTHER PUBLICATIONS

International Search Report and Written Opinion for International Application No. PCT/US2019/057297, dated Jan. 23, 2020.
(Continued)

*Primary Examiner* — Amelie R Davis
*Assistant Examiner* — Helene Bor
(74) *Attorney, Agent, or Firm* — Winthrop & Weinstine, P.A.; Brian R. Pollack, Esq.

(57) ABSTRACT

The present disclosure provides medical devices having MRI-compatible circuitry. Preferably, the devices do not project an enlarged profile, yet their position can be determined during an iMRI procedure. Illustrative embodiments of such a device can include a base surface, a first conducting layer disposed on the base surface, a first insulating layer disposed over at least a portion of the first conducting layer, and a second conducting layer disposed over at least a portion of the first insulating layer.

18 Claims, 14 Drawing Sheets

(56) References Cited

U.S. PATENT DOCUMENTS

| | | | |
|---|---|---|---|
| 6,606,513 B2 | 8/2003 | Lardo et al. | |
| 7,236,816 B2 | 6/2007 | Kumar et al. | |
| 7,551,953 B2 | 1/2009 | Lardo et al. | |
| 7,725,161 B2 | 5/2010 | Karmarkar et al. | |
| 8,478,381 B2 | 7/2013 | Kocaturk | |
| RE44,736 E | 1/2014 | Karmarkar et al. | |
| 8,825,133 B2 | 9/2014 | Jenkins et al. | |
| 9,259,556 B2 | 2/2016 | Kocaturk | |
| 9,486,158 B2 | 11/2016 | Kocaturk | |
| 2002/0045816 A1* | 4/2002 | Atalar | G01R 33/285 600/423 |
| 2003/0050557 A1 | 3/2003 | Susil et al. | |
| 2005/0080333 A1 | 4/2005 | Piron et al. | |
| 2006/0206108 A1* | 9/2006 | Hempel | A61N 5/00 606/33 |
| 2007/0265637 A1* | 11/2007 | Andreas | A61F 2/966 606/108 |
| 2008/0051854 A1 | 2/2008 | Bulkes et al. | |
| 2008/0114235 A1* | 5/2008 | Unal | G01R 33/4824 600/411 |
| 2009/0118610 A1* | 5/2009 | Karmarkar | A61B 5/369 600/420 |
| 2014/0266207 A1* | 9/2014 | Karmarkar | A61B 18/1492 324/322 |
| 2015/0338477 A1 | 11/2015 | Schmidt et al. | |
| 2016/0128592 A1 | 5/2016 | Rosen et al. | |
| 2016/0331960 A1 | 11/2016 | Katnani et al. | |
| 2017/0143234 A1 | 5/2017 | Degertekin et al. | |
| 2018/0085027 A1* | 3/2018 | Kimmel | A61B 5/24 |
| 2018/0132754 A1* | 5/2018 | Kusumoto | A61B 5/7445 |
| 2021/0068897 A1* | 3/2021 | Wong | A61B 34/20 |

OTHER PUBLICATIONS

A Deflectable Guiding Catheter for Real-Time MRI-Guided Interventions, Journal of Magnetic Resonance Imaging 35:908-915 (2012).

International Search Report for International Application No. PCT/US2021/028725, dated Aug. 12, 2021.

Written Opinion for International Application No. PCT/US2021/028725, dated Aug. 12, 2021.

Specification of International Application No. PCT/US2021/028725 including claims examined by International Searching Authority.

Extended European Search Report for EP Application 19874136.5, dated Jun. 29, 2022, 8 pages.

* cited by examiner

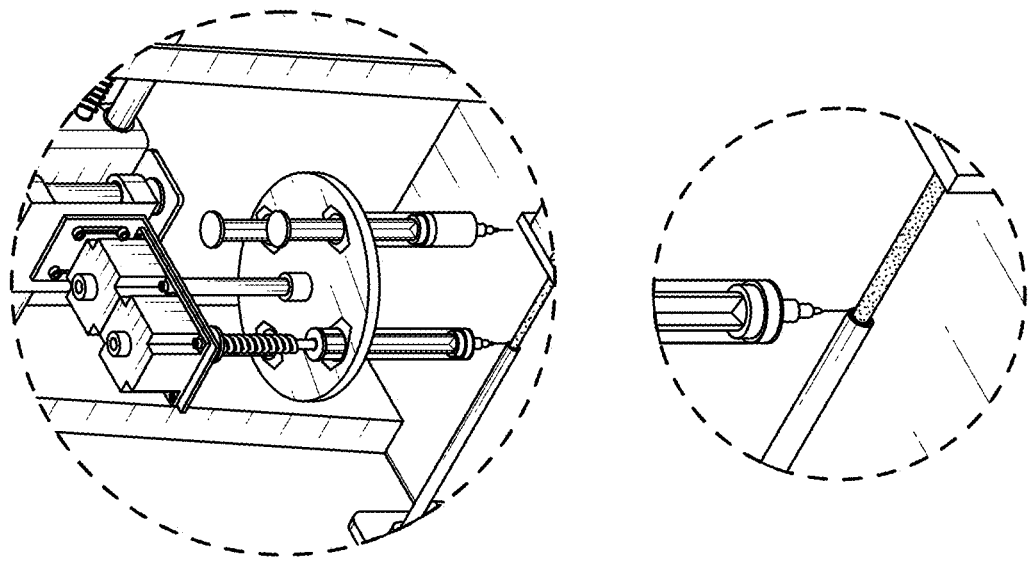
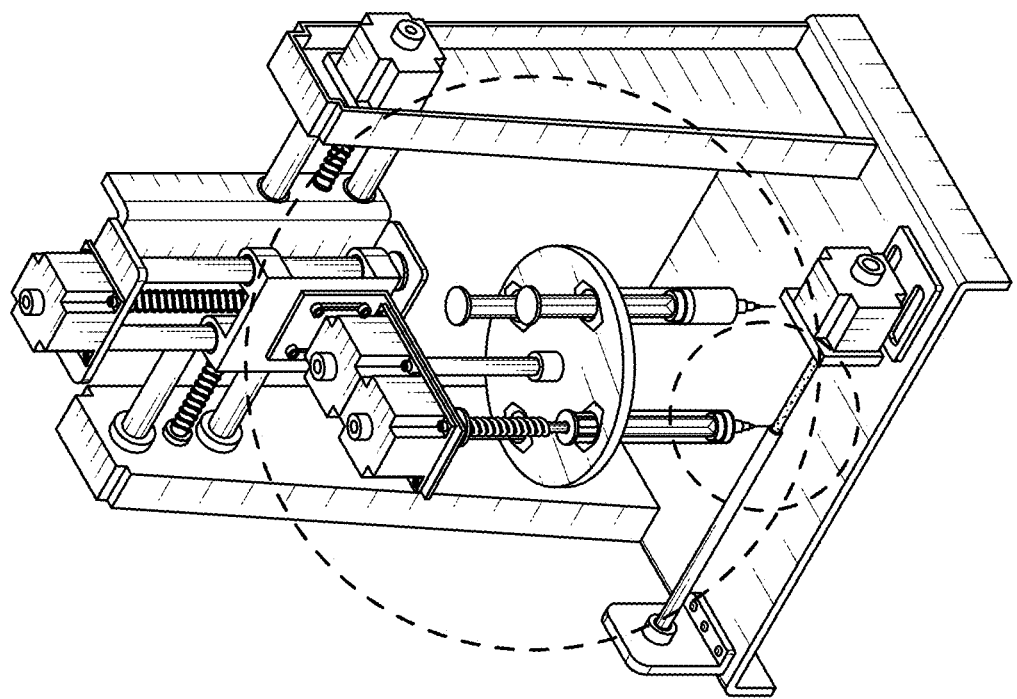
FIG. 4

MRI-COMPATIBLE DEVICES

CROSS-REFERENCE TO RELATED APPLICATION

The present patent application is a continuation-in-part of and claims the benefit of priority to International Application No. PCT/US21/28725, filed Apr. 22, 2021, which in turn claims the benefit of priority to U.S. patent application Ser. No. 17/234,608, filed Apr. 19, 2021, U.S. Provisional Application No. 63/013,977, filed Apr. 22, 2020, and U.S. Provisional Application No. 63/170,682, filed Apr. 5, 2021. The present patent application is a continuation in part of and claims the benefit of priority to International Patent Application No. PCT/US2019/57297, filed Oct. 21, 2019, which in turn claims the benefit of priority to U.S. Patent Application Ser. No. 62/748,026, filed Oct. 19, 2018. Each of the foregoing patent applications is incorporated by reference herein in its entirety for any purpose whatsoever.

FIELD

This disclosure relates generally to interventional devices designed to be actively visualized through embedded Radio Frequency (RF) antennas during interventional Magnetic Resonance Imaging procedures.

BACKGROUND

Interventional Magnetic Resonance Imaging has a great potential to replace conventional X-ray based fluoroscopy guidance during interventional procedures. However, interventional device visualization under MRI is more complex compared to commercial interventional devices used in X-ray based procedures. The present disclosure provides solutions for these and other problems.

SUMMARY OF THE DISCLOSURE

Advantages of the present disclosure will be set forth in and become apparent from the description that follows. Additional advantages of the disclosure will be realized and attained by the methods and systems particularly pointed out in the written description and claims hereof, as well as from the appended drawings.

The interventionist performing a procedure, such as a cardiovascular percutaneous procedure, needs to visualize the distal tip location of the catheter and the entire shaft of the device in order to navigate within vascular structures and perform interventional procedures such as cardiac diagnostic or therapeutic catheterization, cardiac ablation, oncological procedures such as breast, liver, brain or prostate biopsy, drug/contrast agent injection, and the like, safely.

There are two main techniques to visualize devices under MRI named passive visualization and active visualization. Passive visualization depends on the intrinsic susceptibility artifact of metallic components that cause signal void during magnetic resonance imaging. Passively-visualized devices have poor contrast dependent on the device orientation relative to the main magnetic field and often create image artifacts much larger than the actual device profile. Actively-visualized devices incorporate radio frequency receiver antennas. After RF excitation through the RF body coil of MRI scanner, the excited hydrogen protons within the body relax back and emit RF waves. These RF waves can be picked up through RF receiver antennas that are in close vicinity of these hydrogen protons. The SNR (signal to noise ratio) of the antenna is closely related to tuning of the antenna to the Larmor frequency (resonance frequency) of the MRI scanner and also matching with impedance of the RF coil plug of the scanner. Generally, loop or coil antennas are used for distal tip visualization in an interventional MRI ("iMRI") device and appear as a "bright spot" under real-time MRI guidance. Monopole or dipole antennas are typically used for overall shaft visualization.

However, the received signal profile and signal to noise ratio (SNR) of the received signal also depend on the RF receiver antenna geometry, conductive material and insulation material between conductive layers. The conventional RF receiver antennas are fabricated using insulated or bare conductors in the form of wire, rod, sheet, twisted pair, coax cable or tube. Therefore, fine tuning of the characteristic impedance values of each antenna components that will affect the receive signal profile is not practical.

The present disclosure provides embodiments wherein it is possible to control the impedance value of certain sections of a single antenna component. While overall antenna characteristic impedance is inductive, one can nonetheless form capacitive sub sections to modify the antenna received signal profile by changing the antenna component profile. This can be accomplished, for example, by making different segments of the antenna from sub sections having wider/narrower and/or thicker/thinner conductive material. Moreover, the conductivity of the conductors themselves can be selected to control the received signal profile of the overall antenna precisely. This can be expected to result in improved MRI devices having a signal profile that is not larger than the physical device profile itself. This can help prevent obscuring the important anatomical image.

Physicians typically require both device tip and shaft visualization at the same time. In certain applications such as a tumor biopsy, physicians even need to know the overall insertion length of the needle in real time. Therefore, active interventional MRI devices known in the art are inadequate because they incorporate multiple RF receiver antenna components that increase overall device profile and also adversely affect the mechanical performance.

Additionally, the active devices incorporating metallic components are subject to RF induced heating risk during MRI scans. In general, when the electrical length of the metallic parts is comparable to the wavelength of the Larmor frequency (i.e. longer than the quarter wavelength of scanner RF transmitter system) then the amount of heating may exceed the allowed range (2 C temperature rise in torso area) based on international standards (ASTM 2182).

Conventional active MRI devices have highly conductive antenna components and transmission lines to conduct the received RF signal to the MR scanner with minimal signal loss for device visualization purpose. However, these conductive structures also may couple with RF transmit power during MRI scan and RF induced current flows through the device. The blood vessels and tissues surrounding the active MRI devices during interventional procedures have high electrical resistance. When the RF induced current flows from the active device to the surrounding tissues (i.e. from the distal tip of the active device which has the highest current density along the device), resistive heating is then generated at the device-tissue interface, causing a sudden temperature increase that could be dangerous for the patients. Applicant has come to appreciate that this can be addressed by configuring the electrical properties of the devices to match or closely match the impedance of the surrounding anatomy, as reducing the difference in impedances will reduce such resistive heating.

It is thus one object of the present disclosure to provide RF receiver antenna fabrication methods that permit construction of devices that can be used to visualize at all desired locations over the device profile using a single antenna design without altering the mechanical performance of the device, and also to minimize RF induced heating over the device body by altering the characteristic impedance of specific parts of conductive structures in a seamless manner.

To achieve these and other advantages and in accordance with the purpose of the disclosure, as embodied herein, in one embodiment, the disclosure provides medical devices having MRI-compatible circuitry insofar as the devices do not project an enlarged profile, yet their position can be determined during an iMRI procedure. Illustrative embodiments of such a device includes a base surface, a first conducting layer disposed on the base surface, a first insulating layer disposed over at least a portion of the first conducting layer, and a second conducting layer disposed over at least a portion of the first insulating layer.

In some implementations, one or both of the first conducting layer and second conducting layer can be formed from a plurality of discrete lengths of electrically conductive material. For example, the first conducting layer and second conducting layer can be formed from alternating lengths of electrically conductive material that have different impedances, such as by configuring the alternating lengths to have different geometries, such as by having different thicknesses and/or different widths. The plurality of discrete lengths of electrically conductive material can be made from material having the same bulk electrical properties, the same material, or from different materials, for example. One or both of the first conducting layer and the second conducting layer can be selectively formed to each have an impedance that substantially matches anatomy adjacent to the medical device, for example, to prevent or minimize heating from occurring at the boundary with the anatomy due to an impedance mismatch.

In some implementations, the first conducting layer can form at least a portion of a first transmission line, and further wherein the second conducting layer can form at least a portion of a second transmission line.

If desired, the alternating lengths of electrically conductive material can each have a length that is less than about one quarter of a wavelength of an applied RF signal corresponding to a background magnetic field $B_0$ of a MR scanner so as to reduce, minimize, or prevent standing wave heating effects in the electrically conductive material. For example, the alternating lengths can be less than about one quarter of a wavelength for the applied RF signal background magnetic field between 0.1 T and about 10.0 T in increments of about 0.1 T.

If desired, one or both of the first conductive layer and second conductive layer can be printed onto the medical device. For example, the first conductive layer and second conductive layer can be printed onto the medical device using different materials, and may be printed onto the medical device into configurations having different geometries. If desired, the first insulating layer is printed onto the medical device. Alternatively, at least one of the first conductive layer, second conductive layer and first insulating layer can be formed using a technique other than printing. For example, at least one of the first conductive layer, second conductive layer and first insulating layer can be formed at least in part by using one or more of a chemical vapor deposition technique, a plasma enhanced chemical vapor deposition technique, a chemical etching process, and a laser ablation process, among others. If desired, at least one of the first conductive layer and second conductive layer can be formed by adhering a planar conductor in sheet form onto the medical device. The first insulating layer can be formed at least in part by heat shrinking a polymeric body around at least a portion of the medical device.

In some implementations, the base surface upon which the first conductive layer is formed can an insulating material. If desired, the device can include a layer of insulating material disposed over at least a portion of the surface of the base surface and underneath at least a portion of the first conductive layer. If desired, the device can further include a layer of insulating material disposed over the second conductive layer.

In some implementations, the device can further include at least one conductive winding disposed on the medical device that is electrically coupled to at least one of the first conductive layer and the second conductive layer. If desired, the first conductive layer can be electrically coupled to the second conductive layer at a location where the first insulating layer is not present. In some implementations, the base surface can include an insulating sleeve configured to be fitted over at least a portion of a further device.

In some implementations, the medical device can be an interventional MRI ("iMRI") medical device. For example, the iMRI device can be a cardiovascular medical device such as a needle, a catheter, a device delivery catheter, a guidewire, an endoscope, a flexible catheter, an implant, a shunt, a stent, a pacemaker, and a pacemaker lead, among others. The iMRI device can be an orthopedic medical device such as a spinal rod, a pedicle screw, a bone plate, a pin, an interbody fusion device, and the like. The iMRI device can be a diagnostic medical device such as a biopsy needle, a probe, a dye introduction catheter, and the like. In some implementations, the iMRI device can be a laparoscopic surgical device such as an endoscope, an electrosurgical cutting instrument, an ultrasonic dissector, a surgical mesh, and the like. In some embodiments, the iMRI device is a gynecological medical device such as a uterine manipulator, a tissue dissector, a probe, an electrocautery device, and the like. If desired, the iMRI device can be a therapeutic medical device such as an implant, a neuromodulation device, a patch, and the like. In some embodiments, the iMRI device can be a resorbable medical device selected from the group consisting of an implant, an RFID tag, a comestible pill, and the like.

In some implementations, a MRI marker including a conductive layer printed onto a base surface is provided as well as methods for making the same. In still further implementations, a variety of methods are provided for making devices in accordance with the present disclosure.

The disclosure also provides implementations of a medical device having MRI-compatible circuitry. The medical device includes an elongate body formed at least in part by an extrusion, the extrusion in turn including at least one transmission line. The at least one transmission line can be formed at least in part from a braided twisted pair of conductors that are electrically insulated from one another.

If desired, the medical device can include a plurality of transmission lines. Each of the transmission lines can in turn be formed at least in part from a braided twisted pair of conductors that are electrically insulated from one another. If desired, the medical device can further include a needle coupled to the extrusion. At least one of the conductors in the braided twisted pair of conductors can include an insulating coating. In some implementations, the braided twisted pair of conductors can be disposed between two co-extruded layers of polymeric material. In other embodiments, the braided layer can be disposed between an inner shaft or tubular member and an outer tubular member, such as one formed by a dipped layer of polymer, or by way of a layer of shrink tubing being shrunk around the inner shaft or tubular member and the braided material. The disclosure further provides methods of making such devices that includes providing a braiding apparatus, and braiding at least one pair of conductors in a twisted pair arrangement to form at least a portion of a medical device.

The disclosure also provides implementations of a medical device having MRI-compatible circuitry that includes a first base surface of a first portion of the medical device, a second base surface of a second portion of the medical device, the second portion of the medical device being movable with respect to the first portion of the medical device, and a first conducting layer disposed on the first base surface and the second base surface, wherein in a first relative orientation of the first portion of the medical device to the second portion of the medical device, an electrical circuit is closed that is visible under MR imaging, and further wherein in a second relative orientation of the first portion of the medical device to the second portion of the medical device, the electrical circuit is opened. If desired, the first portion of the medical device can be an inner member and the second portion of the medical device can be an outer tubular member. The inner member can be slidably disposed within the outer tubular member.

If desired, the circuitry of the medical device can be placed into at least two discrete selectable states by relative movement of the inner member with respect to the outer tubular member, wherein a different circuit path is completed in each selectable state. In some implementations, at least a portion of the medical device can be visible under MR imaging in at least two of said selectable states. If desired, at least a portion of the medical device can be visible under MR imaging in a first of the selectable states, and further wherein the medical device can be configured to carry out a discrete function in a second state of the two selectable states. For example, the discrete function includes ablating tissue, temperature measurement, and the like. In some implementations, the medical device can include a biopsy needle or a catheter with a retractable sheath, for example. The medical device can include a prosthesis delivery catheter. The prosthesis can include, for example, a stent, an artificial valve, and the like.

The disclosure still further provides implementations of a medical device having MRI-compatible circuitry. The device can include a first body, such as an outer elongate tubular body including electrical circuitry formed thereon, and a second elongate body including electrical circuitry formed thereon, the second elongate body being movably disposed with respect to the first body. For example, the second body can be movably disposed within a portion of the first body. Relative movement of the second elongate body with respect to the first body (e.g., outer elongate tubular body) from a first relative position to a second relative position completes an electrical circuit that passes through at least a portion of the circuitry of both the outer elongate tubular body and the second elongate body.

If desired, the medical device can include a biopsy needle, wherein, when aligned in the second relative position, a window in the outer elongate body aligns with a compartment defined in the second elongate body to facilitate collection of a tissue sample. When aligned in the second relative position, visibility under MRI of a portion of the medical device proximate the window in the outer elongate body can be enhanced by completion of the electrical circuit.

If desired, the second elongate body can be moved longitudinally and rotationally with respect to the outer elongate tubular body. Each of the second elongate body and outer elongate tubular body can defines thereon, respectively, a first layer of electrically insulating material, and a second layer of electrically conducting material deposited over the first layer of electrically insulating material.

In some implementations, the electrical circuitry on at least one of the second elongate body and outer elongate tubular body includes transmission lines. The electrical circuitry on at least one of the second elongate body and outer elongate tubular body can further include RF loop coils. The electrical circuitry on at least one of the second elongate body and outer elongate tubular body can further include at least one capacitor. A first leg of a transmission line can be formed on an outer surface of the second elongate body, and a second leg of the transmission line can be formed on a surface of the outer elongate tubular body. When in the first relative position, a first resonant circuit can be formed. When in the second relative position, a second, different resonant circuit can be formed.

In some implementations, the medical device can be a catheter having two or more discrete positions for components that can be moved with respect to each other. The catheter can include a retractable sheath to be retracted proximally to expose a prosthesis in situ at a target location. If desired, the device can be an active MRI device that is visible under MRI with the sheath in a distal position, wherein a circuit is completed through the sheath and into an inner member of the catheter having a transmission line formed on its outer surface that extends toward a proximal end of the medical device. The sheath can be withdrawn to a proximal position, and an electrical contact formed on the sheath can complete a circuit with a second conductor formed on an inner member of the catheter.

In some implementations, the catheter can include at least one stent disposed underneath the sheath. The catheter can include a plurality of prostheses disposed underneath the sheath, wherein (i) a first resonant circuit can be formed when the sheath is closed and in a first, distal position, and (ii) a second resonant circuit can be formed when the sheath has withdrawn to permit a first prosthesis to be exposed and deployed. If desired, a third resonant circuit can be formed when the sheath is retracted to a third position. A fourth resonant circuit can be formed when the sheath is retracted to a fourth position.

In some implementations, the electrical circuitry on at least one of the second elongate body and outer elongate tubular body can further include RF saddle coils. The RF saddle coil and a transmission line coupled thereto can be formed by a single layer of conductive material. If desired, the medical device can include a device selected from the group including, for example, a soft biopsy group such as a breast biopsy needle. By way of further example, the device can include a liver biopsy needle, a bone marrow biopsy needle, and a prostate biopsy needle.

In some implementations, the electrical circuit can form at least a portion of a matching or detuning circuit, a transmission line for a temperature sensor, a transmission line for a RF ablation probe, a therapeutic device, or a diagnostic device, for example. The electrical circuit can form at least a portion of at least one active visualization marker to measure insertion depth under MRI visualization. The at least one active visualization marker can include a plurality of active visualization markers disposed along a length of the medical device at set intervals to facilitate measurement of insertion depth.

The disclosure further provides an interventional MRI medical device that includes a plurality of electrical circuits formed thereon to facilitate visualization of the medical device at different background magnetic fields of a MR scanner. The plurality of electrical circuits can function as active MRI markers. The plurality of electrical circuits can function as passive or semi-active MRI markers. The plurality of electrical circuits can function as visualization markers at background fields of 0.55 T, 1.5 T and 3.0 T, among others. Thus, each of the plurality of electrical circuits functions as a MRI marker at a different background magnetic field to permit the device to be visible in MR scanners of different background magnetic fields.

The medical device as disclosed herein can include at least a portion of at least one of a needle, a catheter, a device delivery catheter, a guidewire, an ablation guidewire, an endoscope, a flexible catheter, an implant, a shunt, a stent, a pacemaker, and a pacemaker lead, a spinal rod, a pedicle screw, a bone plate, a pin, an interbody fusion device, a biopsy needle, a probe, a dye introduction catheter, an endoscope, an electrosurgical cutting instrument, an ultrasonic dissector, a surgical mesh, a uterine manipulator, a tissue dissector, a probe, an electrocautery device, an implant, a neuromodulation device, and a patch.

It is to be understood that the foregoing general description and the following detailed description are exemplary and are intended to provide further explanation of the disclosed embodiments. The accompanying drawings, which are incorporated in and constitute part of this specification, are included to illustrate and provide a further understanding of the disclosed methods and systems. Together with the description, the drawings serve to explain principles of the disclosure.

BRIEF DESCRIPTION OF THE FIGURES

FIG. 4 presents a first set of views of a conductor and insulator ink printing system with multiple heads in accordance with the present disclosure.

DETAILED DESCRIPTION OF PREFERRED EMBODIMENTS

Reference will now be made in detail to the present preferred embodiments of the disclosure, examples of which are illustrated in the accompanying drawings. The methods and corresponding steps of the disclosed embodiments will be described in conjunction with the detailed description of the system.

The present disclosure provides embodiments of devices that are useful in interventional MRI (so-called "iMRI") procedures. Applicant has noticed that a variety of attempts have been made in order to make devices, such as surgical instruments and implants more MRI compatible. But, such devices have shortcomings.

Figure 1:
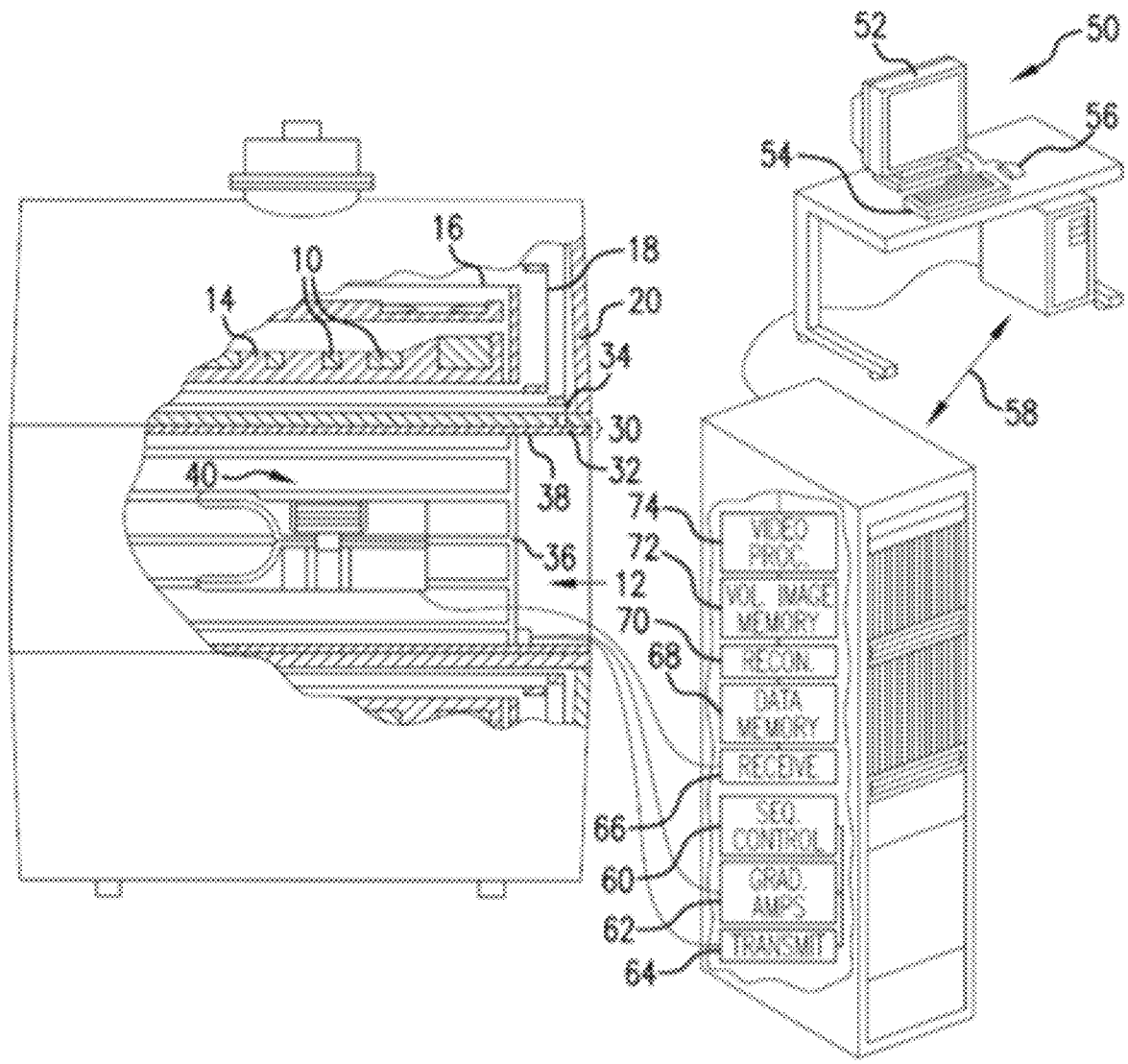
FIG. 1 is an illustrative example of a MRI system.

By way of reference, an exemplary magnetic resonance system is depicted in FIG. 1, and includes a plurality of primary magnetic coils 10 that generate a uniform, temporally constant magnetic field $B_0$ along a longitudinal or z-axis of a central bore 12 of the device. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum Dewar 20. Of course, annular resistive magnets, C-magnets, and the like are also contemplated.

Figure 2:
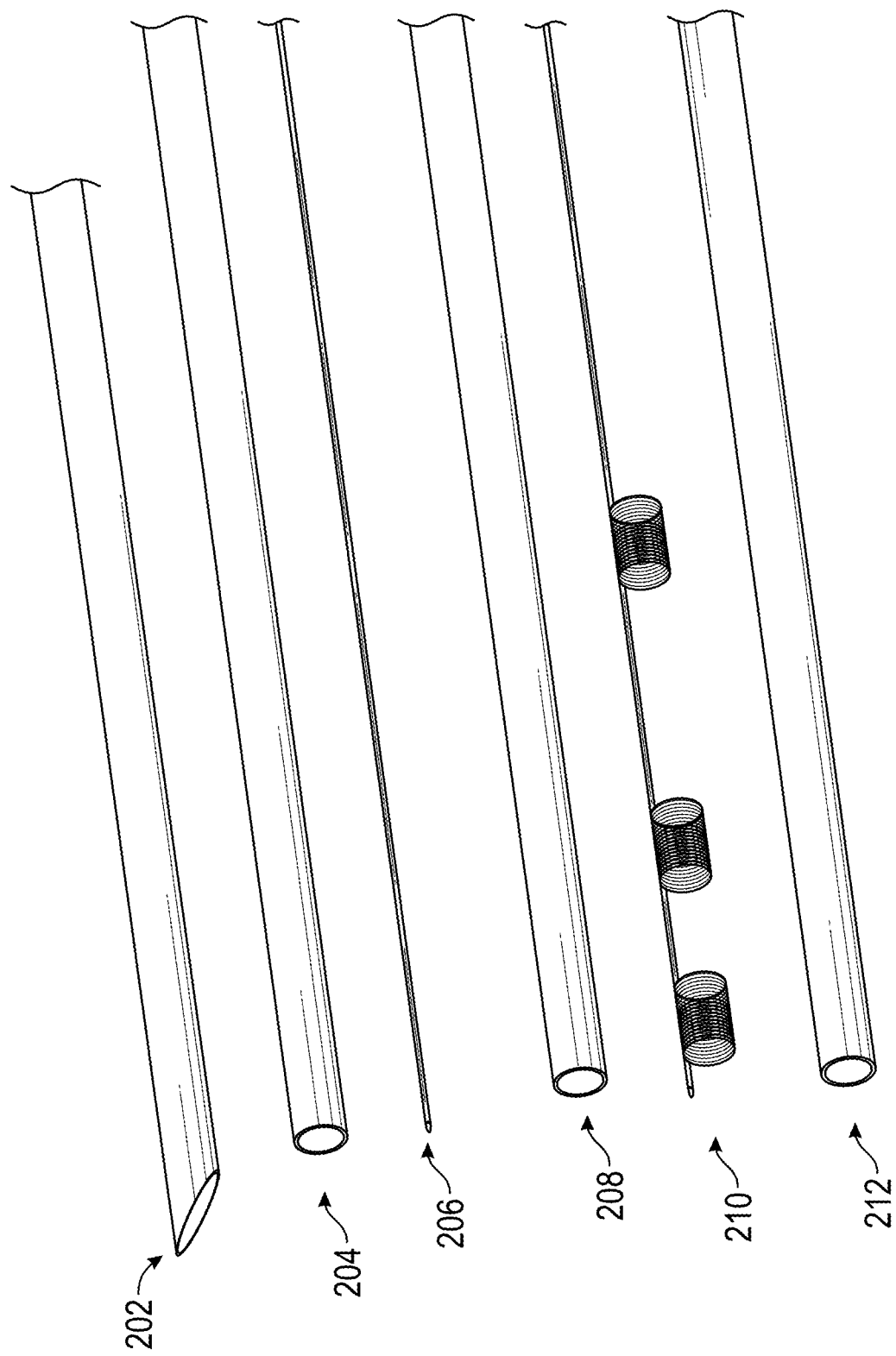
FIG. 2 is an illustration of a multiple layer structure of an RF antenna design printed directly onto a device surface in accordance with the present disclosure.

A whole body gradient coil assembly 30 includes x, y, and z-coils mounted along the bore 12 for generating gradient magnetic fields, Gx, Gy, and Gz. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum Dewar 20. A whole body radio frequency coil 36 can be mounted inside the gradient coil assembly 30. A whole body radio frequency shield 38, e.g., copper mesh, can be mounted between the whole body RF coil 36 and the gradient coil assembly 30. If desired, an insertable radio frequency coil 40 can be removably mounted in the bore in an examination region defined around an isocenter of the magnet 10. In the embodiment of FIG. 2, the insertable radio frequency coil is a head and neck coil for imaging one or both of patient's head and neck, but other extremity coils can be provided, such as back coils for imaging the spine, knee coils, shoulder coils, breast coils, wrist coils and the like.

With continuing reference to FIG. 1, an operator interface and control station is provided that includes a human-readable display, such as a video monitor 52, and operator input devices such as a keyboard 54, a mouse 56, a trackball, light pen, or the like. A computer control and reconstruction module 58 is also provided that includes hardware and software for enabling the operator to select among a plurality of preprogrammed magnetic resonance sequences that are stored in a sequence control memory, if RF pulses are to be used as a part of the imaging study. A sequence controller 60 controls gradient amplifiers 62 connected with the gradient coil assembly 30 for causing the generation of the Gx, Gy, and Gz gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence, if RF pulses are to be used in the study.

MR signals received by the coil 40 are demodulated by a digital receiver 66 and stored in a data memory 68. The data from the data memory are reconstructed by a reconstruction or array processor 70 into a volumetric image representation that is stored in an image memory 72. If a phased array is used as the receiving coil assembly, the image can be reconstructed from the coil signals. A video processor 74 under operator control converts selected portions of the volumetric image representation into slice images, projection images, perspective views, or the like as is conventional in the art for display on the video monitor.

In further accordance with the disclosure, medical devices are provided having MRI-compatible circuitry. Illustrative devices include a base surface, a first conducting layer disposed on the base surface, a first insulating layer disposed over at least a portion of the first conducting layer, and a second conducting layer disposed over at least a portion of the first insulating layer.

Embodiments of the present disclosure include active interventional MRI devices, systems and methods. In some embodiments, the devices include antennas that are formed at least in part by printing conductors and/or insulating layers on a substrate. Whether printed or formed by other means, the disclosure provides, among other things, multi-layer RF antenna assemblies embedded into interventional devices as described herein as well as RF signal matching/detuning circuitry.

In an illustrative embodiment, the present disclosure provides RF receiver antenna designs (such as single antenna designs) that are printed directly on the device shaft or components to provide both tip and shaft visualization, and minimize RF induced heating under MRI without using conventional antenna components and also without compromising mechanical performance. Active interventional MRI devices with these integrated capabilities are a significant advance in the field of interventional MRI by ensuring safe clinical operation.

As illustrated in FIG. 2, an exploded view of an illustrative MRI needle is presented showing a base layer of a bare needle 202 having a surface. A second insulating layer 204 is printed or otherwise deposited on the base layer. For example, the layer 204 can be formed via heat shrink tubing, printing insulating material on the surface of 202, dipping in a polymer, and the like, for example. A first layer of conductive material is formed as a ground layer 206 of a transmission line is formed on top of the layer 204 by any technique as set forth elsewhere herein. A second insulating layer 208 is then deposited over ground layer 206 using any desired technique. A second layer of conductive material 210 can then be formed using any desired technique that can include a further transmission line and one or more antenna coils, illustrated herein as loop coils. A final insulation layer 212 can then be formed or heat shrunk, for example, over layer 212.

Figure 3:
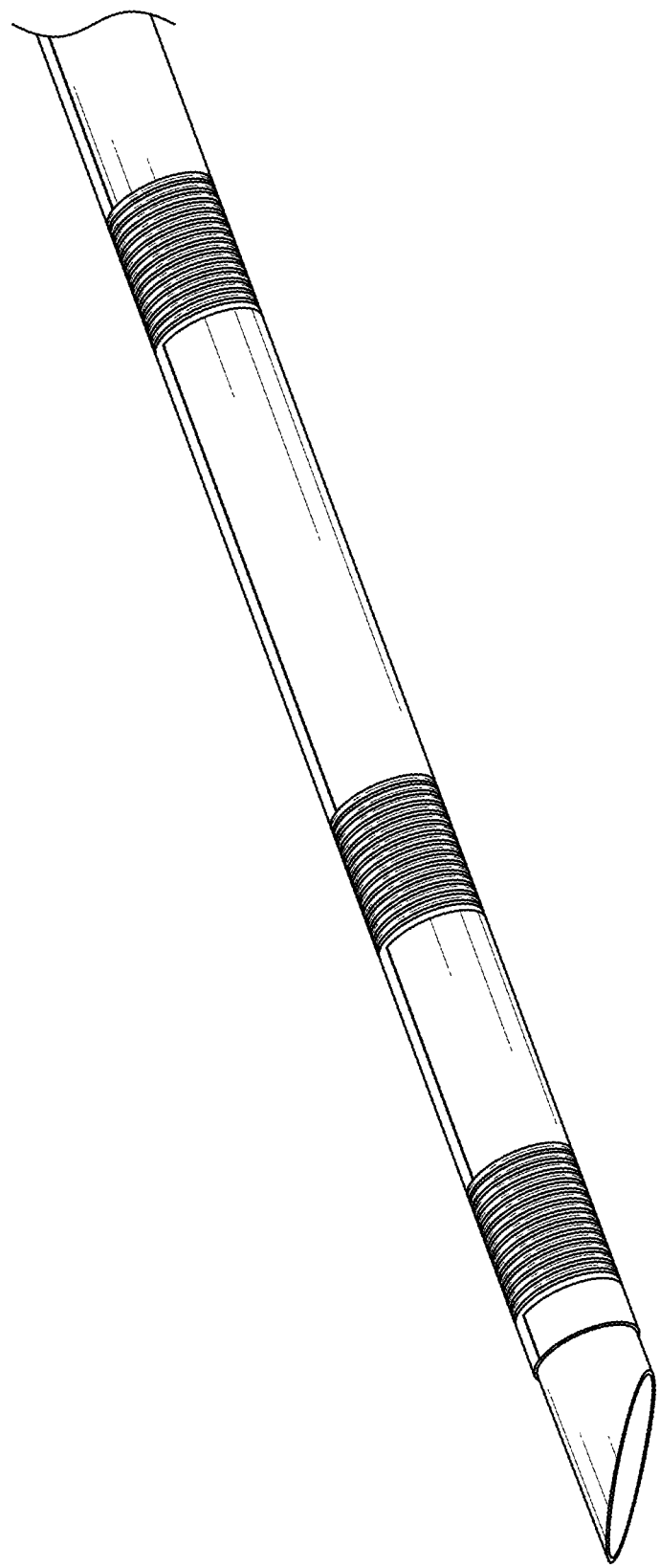
FIG. 3 is an isometric rendering of an illustrative iMRI device in accordance with the present disclosure.

It will be appreciated that any of the layers of the device depicted in FIG. 2 can be formed using any desired process, including but not limited to those processes described and/or mentioned herein. For example, a mixture of processes as set forth herein can be used to form one or more of the layers. In one embodiment, an insulating layer is formed using heat shrinking, dipping, printing, or the like, and that layer can be etched or ablated to expose underlying conductor that can then be placed in electrical contact with one or more subsequent conductive layers. Any desired number of layers of conductive and insulating material can be used to form any desired circuit. Moreover, any of the layers can be formed completely or partially over the surface of the device. FIG. 3 presents the final assembly of the components illustrated in FIG. 2.

Figure 5:
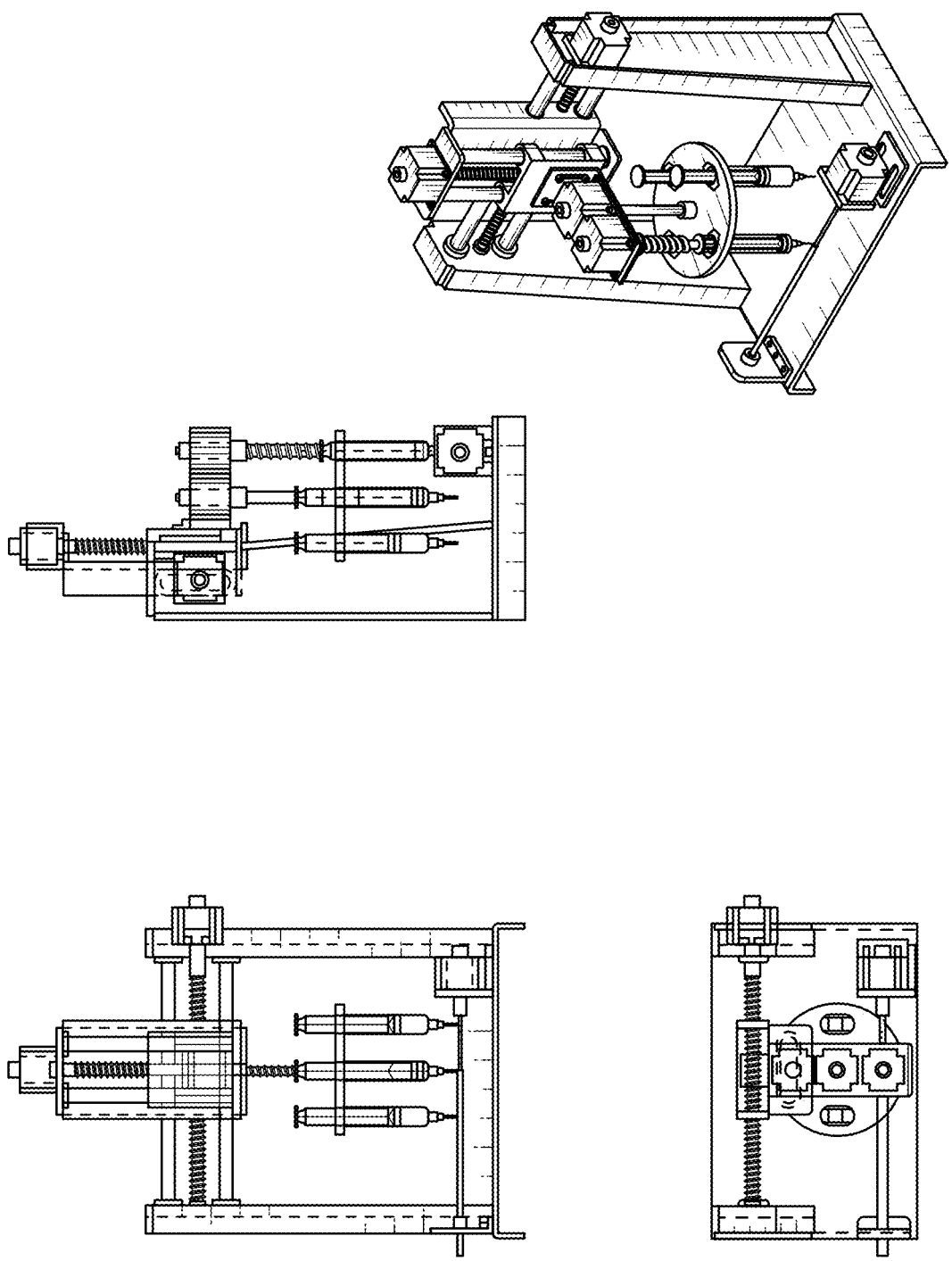
FIG. 5 illustrates further views of an antenna printing system in accordance with the disclosure.
Figure 6:
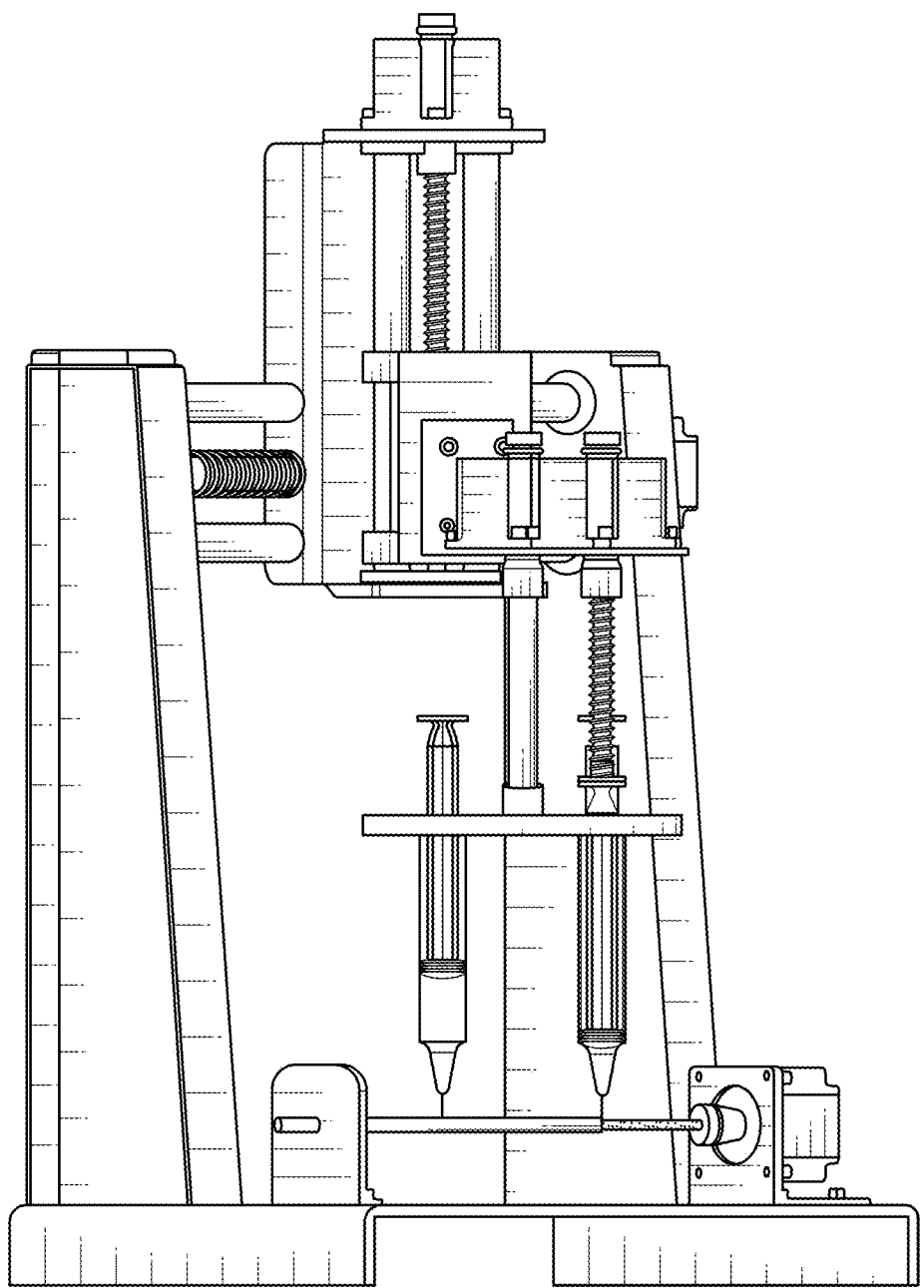
FIG. 6 illustrates an example of printing a RF receiver antenna over a catheter shaft.

In an exemplary embodiment, and as illustrated in FIGS. 4-6, a RF antenna printing system is illustrated in the form of a 4-axis CNC system that is configured to print each layer of an RF antenna design onto a substrate, such as an interventional device shaft (e.g., 202 in FIG. 2). In an illustrative implementation, an interventional device shaft can be mounted onto a hollow shaft rotary axis (FIG. 4, Detail "B"), and a printing head can be mounted on one of the linear axes (e.g, the Z axis), and the printing head can be moved along the other two axes (X and Y axes) to achieve the printing operation in cooperation with rotating the shaft about a rotational axis and adjusting the height of the workpiece and/or the printing head along the Z (vertical) axis.

A single channel RF antenna design, for example, can be formed from multiple layers using 3D design software. The specific sections of the antenna and/or transmission line can be marked to be printed with high impedance ink (i.e. almost matching the complex impedance of the neighboring tissue or anatomical structures). The drawing can be converted to standard G codes using post processing software and special M codes can be assigned to change the ink source for altering the complex impedance of the antenna components and also including insulation layer between two adjacent conductive layers during printing the RF antenna onto the device shaft. Instead of using conventional transmission lines (i.e. coaxial cable or twisted pairs) that have homogenous profile along the length, the disclosed novel RF antennas, whether formed all or in part by printing and/or other formation methods, including vapor deposition, foils, chemical etching, laser ablation and the like, permits control of the capacitive and inductive coupling effect along the antenna during MRI scan and also helps to limit RF induced heating over the RF antenna without adding any bulky RF circuit components, such as RF traps, baluns, LC tanks, and the like.

In the illustrated embodiment of FIGS. 2-7, the disclosed RF antenna printing system has a rotating printing head housing multiple printing ink cartridges and nozzles that allows controllable modification of the conductive or insulation ink properties while the antenna is being printed. The position of the rotating printing head can be controlled via a stepper/servo motor. The nozzle can apply the ink to the device shaft surface by dispensing, spraying or pressing, among other techniques.

In one embodiment, the RF antenna design printing system has a dispenser unit incorporating both conductive and insulation ink nozzles mounted on one axis of a 4 axis CNC controller (X, Y, Z and A (rotary) axis). Based on the RF design data and the results of simulations to anticipate performance, the digital RF antenna design can be divided into multiple layers and the digital design file can be converted into G-codes (universal programming language for CNC machines) that are created through post processor software so that the target RF antenna geometry can be printed onto device shaft or components through the CNC unit. This can be accomplished by printing the antenna components with the disclosed multi head dispenser unit. The dispenser unit can have multiple nozzles for printing different conductive and insulator inks onto the device surface based on the design file prepared by the user. Thus, the system can blend two different inks, for example, to achieve desired electrical and mechanical properties in accordance with the design.

The rotary switch mechanism permits switching between conductive ink printing and insulation layer printing, for example, by rotating the dispenser head. The conductive and insulation ink nozzles can be attached to the printing head and the desired conductivity can be achieved by changing the active nozzle on the rotary head, and the desired geometry (e.g., line width, thickness, and orientation) can be achieved by changing printing speed (the faster the axes move the thinner the printed structures). Changing the geometry of the antenna components (e.g., line width, thickness and layout) and insulation layer thickness can create high capacitive impedance in targeted small sections that can alter the signal profile of the overall antenna without changing the inductive characteristics of overall antenna impedance significantly. This is not practicable in conventional RF antenna fabrication methods and this flexibility allows to the user to design and fabricate RF receiver antennas directly onto medical device shafts or components with almost identical features of the simulated antenna design.

In a further embodiment, impedance values of the conductive elements of RF receiver antennas can be adjusted during printing without changing the overall device profile on active medical devices in such a way that the section that is designed to intensify the induced magnetic field can be printed with low impedance ink, and certain sections of the long transmission lines can be printed with wider lines insulated with thinner coating to enhance capacitive coupling between the transmission line and surrounding environment. This can be achieved by altering the characteristic impedance and geometrical shape of each individual antenna component seamlessly through alternating the conductive ink type and changing the movement speed of the printing head instead of using regular conductive transmission line materials (i.e. insulated wire, twisted pair or micro coaxial cable) during fabrication.

It will be appreciated that a layer of conductive material can be formed by printing a mixture of conductive inks in a given location, and/or by layering different conductive inks on top of each other in direct contact, and/or next to each other in direct contact. A given circuit pathway can be formed over a course of layers, for example, by joining layers of conductive material in select locations that are separated in other locations by insulating material and/or spatial separation along the surface of the substrate.

In another embodiment, RF resonant markers can be formed that help to locate a spatial position of a single location under MRI. For example, such markers can be printed over device shafts or components by adjusting the conductor structures width and insulation thickness between adjacent layers to form a LC tank circuit. This can eliminate the long transmission line that is required to transmit the received MR signal to the scanner for active interventional devices.

Figure 7:
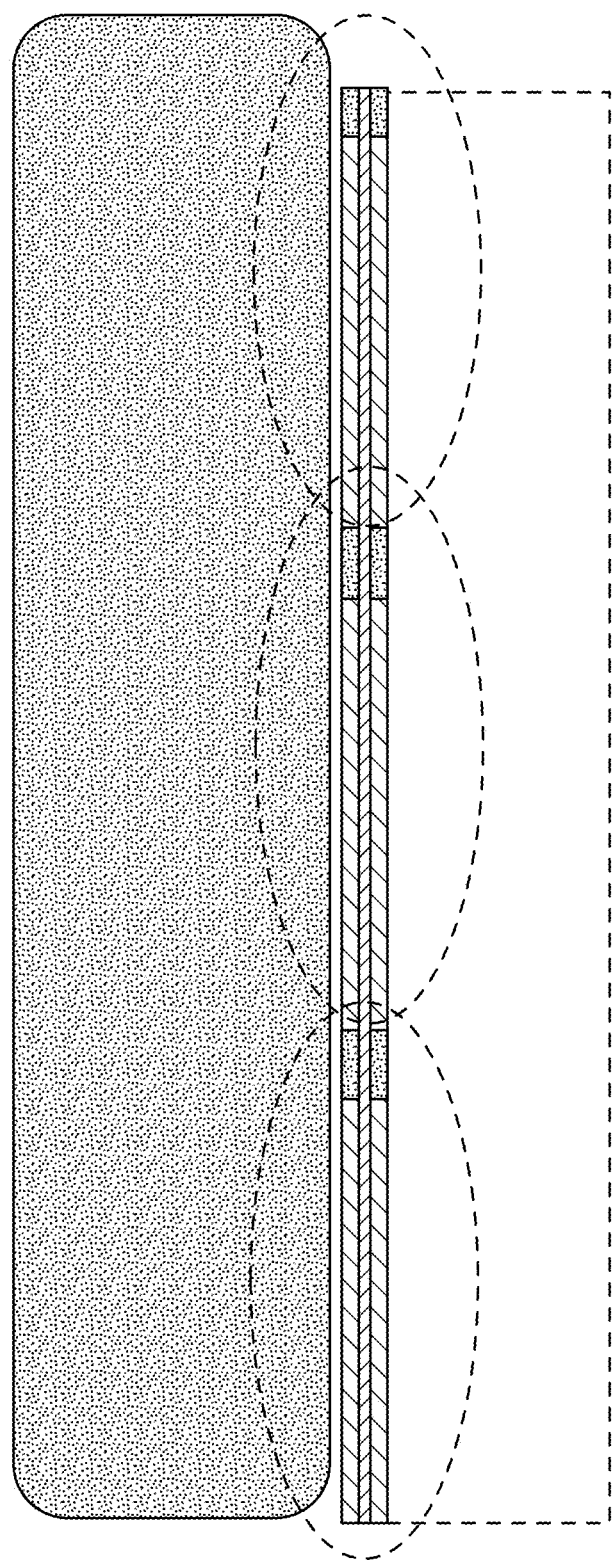
FIG. 7 is an illustrative transmission line design that matches its impedance with surroundings to minimize RF induced heating.

In still another embodiment, an RF antenna can be printed onto the device shaft such a way that the electrical length of the overall RF antenna and its transmission line can be segmented into several subsections, and each subsection length can be comparable to (or less than) a quarter wavelength of the Larmor Frequency of Hydrogen at a wavelength corresponding to the background magnetic field $B_0$ of the scanner (e.g., 64 MHz for 1.5 Tesla), and its complex impedance can be configured so as to be comparable to the neighboring tissue or anatomical structures (FIG. 7). This can be achieved by changing the conductive ink based on a predetermined interval so that each segment has an impedance that matches with its surrounding anatomical structures. Then, induced current density can be homogenous along the shaft and prevent any "hot spot" occurrences along the device shaft. This design also eliminates the need of including bulky analog electrical components to form RF traps or baluns along the transmission line that can both effect overall active device profile and mechanical performance adversely.

These disclosed embodiments permit enhancement of the capacitive coupling between emitted RF signals and certain locations of the RF receiver antenna embedded into interventional devices during MRI scan. This feature provides superior shaft visualization of active MRI devices using just a single antenna design. Also, the capability of impedance changing along a single metallic component also allows to control amount of RF induced heating over active devices that is crucial for patient safety during MRI scan. For example, as illustrated, an active MRI needle can be provided that has one or more RF receiver antennas printed onto the needle shaft that can provide both certain points along the shaft and overall length at the same time.

It will be appreciated that the conductive and insulating layers of the disclosed embodiments can be printed onto the medical device using different materials, and may be printed onto the medical device into configurations having different geometries. Alternatively, one or more layers (or all of the layers) can be formed using a technique other than printing. For example, at least one of the conductive layers and insulating layers can be formed at least in part by using one or more of a chemical vapor deposition technique, a plasma enhanced chemical vapor deposition technique, a chemical etching process, and a laser ablation process, among others. If desired, at least one of the layers can be formed by adhering a planar conductor in sheet form onto the medical device. The first insulating layer can be formed at least in part by heat shrinking a polymeric body around at least a portion of the medical device.

It will be appreciated that, while a MRI needle is specifically illustrated in the drawings, the disclosed techniques and systems can be used to form many different types of devices.

For example, iMRI devices can be formed. Such a device can be a cardiovascular medical device such as a needle, a catheter, a device delivery catheter, a guidewire, an endoscope, a flexible catheter, an implant, a shunt, a stent, a pacemaker, and a pacemaker lead, among others.

The iMRI device can be an orthopedic medical device such as a spinal rod, a pedicle screw, a bone plate, a pin, an interbody fusion device, and the like.

The iMRI device can be a diagnostic medical device such as a biopsy needle, a probe, a dye introduction catheter, and the like.

In some implementations, the iMRI device can be a laparoscopic surgical device such as an endoscope, an electrosurgical cutting instrument, an ultrasonic dissector, a surgical mesh, and the like.

In some embodiments, the iMRI device is a gynecological medical device such as a uterine manipulator, a tissue dissector, a probe, an electrocautery device, and the like.

If desired, the iMRI device can be a therapeutic medical device such as an implant, a neuromodulation device, a patch, and the like.

In some embodiments, the iMRI device can be a resorbable medical device selected from the group consisting of an implant, an RFID tag, a comestible pill, and the like.

Example—Braiding Layer Including Transmission Line

As set forth herein, in further implementations, one or more transmission lines can be provided in a medical device in the process of incorporating a braided conductor into the device. As set forth herein generally, RF transmission lines are useful for carrying RF signals detected by an instrument out to a signal processor and/or computing device to minimize the signal attenuation.

Interventional devices such as those set forth herein can be visualized under MRI by using active visualization or passive visualization techniques. For active device visualization techniques, intravascular devices can incorporate a RF receiver antenna embedded into the device's body. After exciting a region of interest (ROI) in a patient, the hydrogen protons of the patient in the ROI by way of a RF transmission coil of the MR scanner, the antenna(e) in the medical devices can pick up the weak RF signal emitted from the excited protons of the patient when they return back to their lower energy state. After receiving the signal, the signal needs to be transmitted by the medical device to the MR scanner with minimum signal attenuation so that the signal can be used for imaging or device tracking purposes, as desired, for example, by superimposing the image of the medical device, or a portion thereof, onto the MRI images constructed from data received by other imaging coils surrounding the ROI.

Depending on the required mechanical properties such as torquability, pushability and flexibility of the medical device (such as an intravascular catheter), one or more of a variety of different braiding patterns can be used in constructing the medical device, such as full load, half load and diamond patterns in various different braiding equipment (such as a 16 head braider, a 32 head braider and the like). After finalizing the braiding head and pattern due to desired mechanical properties, two of the braiding fibers (and additional pairs of the braiding fibers, as desired) can be replaced with insulated conductor wires (such as enamel coated copper wire) to form a twisted pair transmission line integrated into the braiding layer, such as a layer of braided fibers located between two co-extruded polymeric tubular layers. The opposite turn of each conductor wire forming such a twisted pair can help to cancel out radial E field components of each other that helps to minimize the RF induced heating over the long conductors under Magnetic Resonance Imaging. It also helps to minimize the RF signal attenuation through the twisted pair transmission line while transferring the received signal to the MRI scanner.

Figure 8:
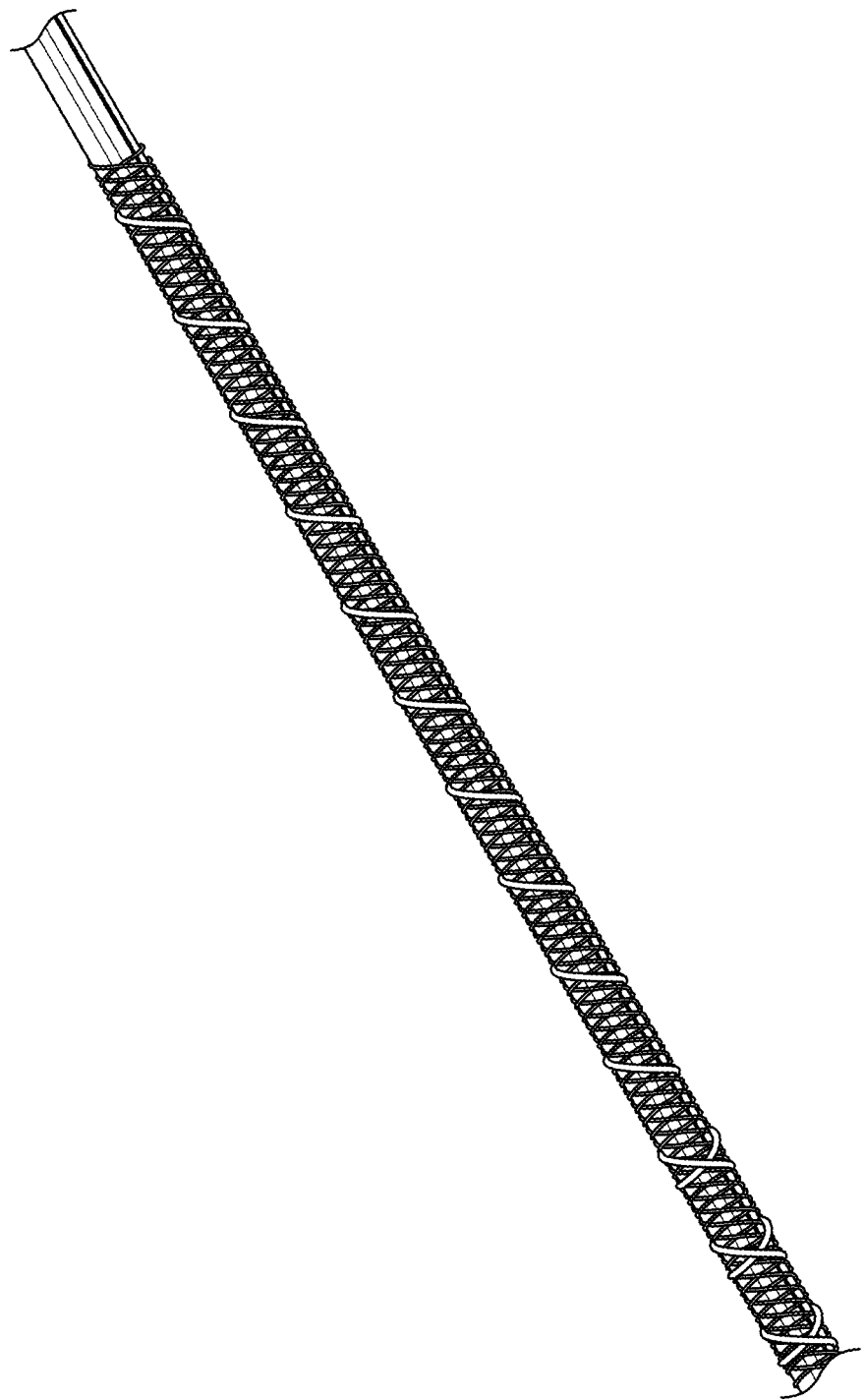
FIGS. 8 and 9 are illustrative embodiments showing a braiding layer formed on a polymeric liner placed over a mandrel.
Figure 9:
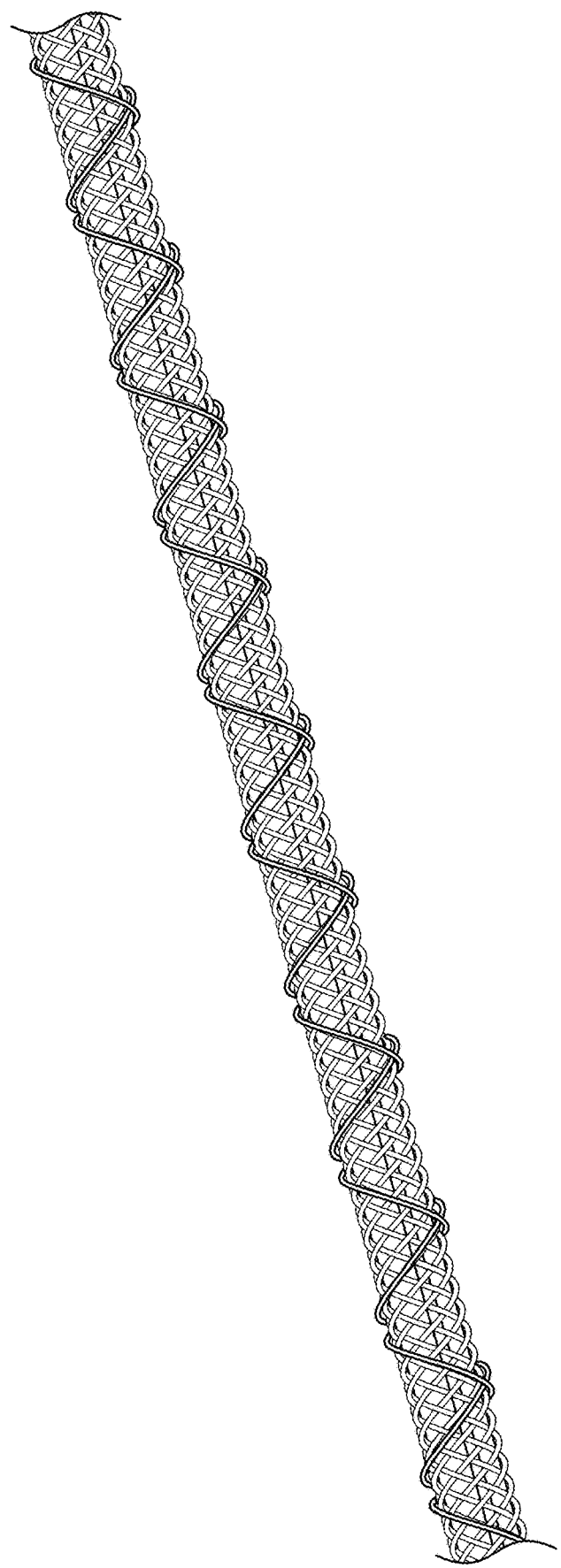

FIG. 8 presents an illustrative example of a hybrid braiding layer on a PTFE liner placed over a mandrel. Two of the braiding fibers in this example are replaced, for example, with enamel coated copper wires that form a twisted pair along the braiding layer. At the distal end one of the copper wires is intentionally cut so that it does not go all the way to the distal tip of the device. The proximal end of the wire is also cut. This permits to have free ends of the transmission line placed into two ends of a solenoid loop coil antenna when the wire is placed over the braiding layer. FIG. 9 illustrates the full twisted pair integrated into the braiding layer.

Example—Biopsy Device

As set forth herein, in further implementations, biopsy medical devices can be provided in accordance with the disclosure. A biopsy needle typically includes two hollow tubes, each defining an opening, or "window" near their distal end. The outer tube is generally a cannula that is inserted into or through tissue and advanced to a target location from which a tissue sample is to be extracted. The inner tube can be slid and/or rotated with respect to the distal end of the cannula. This relative movement can permit the windows in the tubes to be aligned. When the biopsy needle (with cannula and inner tube windows not aligned) has been inserted and advanced to the target location where tissue needs to be collected, the inner tube is rotated (and/or moved longitudinally) so that the two windows become aligned, exposing tissue to the interior of the inner tube. The inner core usually defines a specified volume for harvesting the specimen. When the specimen enters through the windows, it presses into the defined volume. The inner and outer tubes are then moved with respect to each other again, and the edge of the window of the inner and/or outer tube act as a cutter to separate tissue within the volume of the inner tube from tissue outside the biopsy needle.

Figure 10:
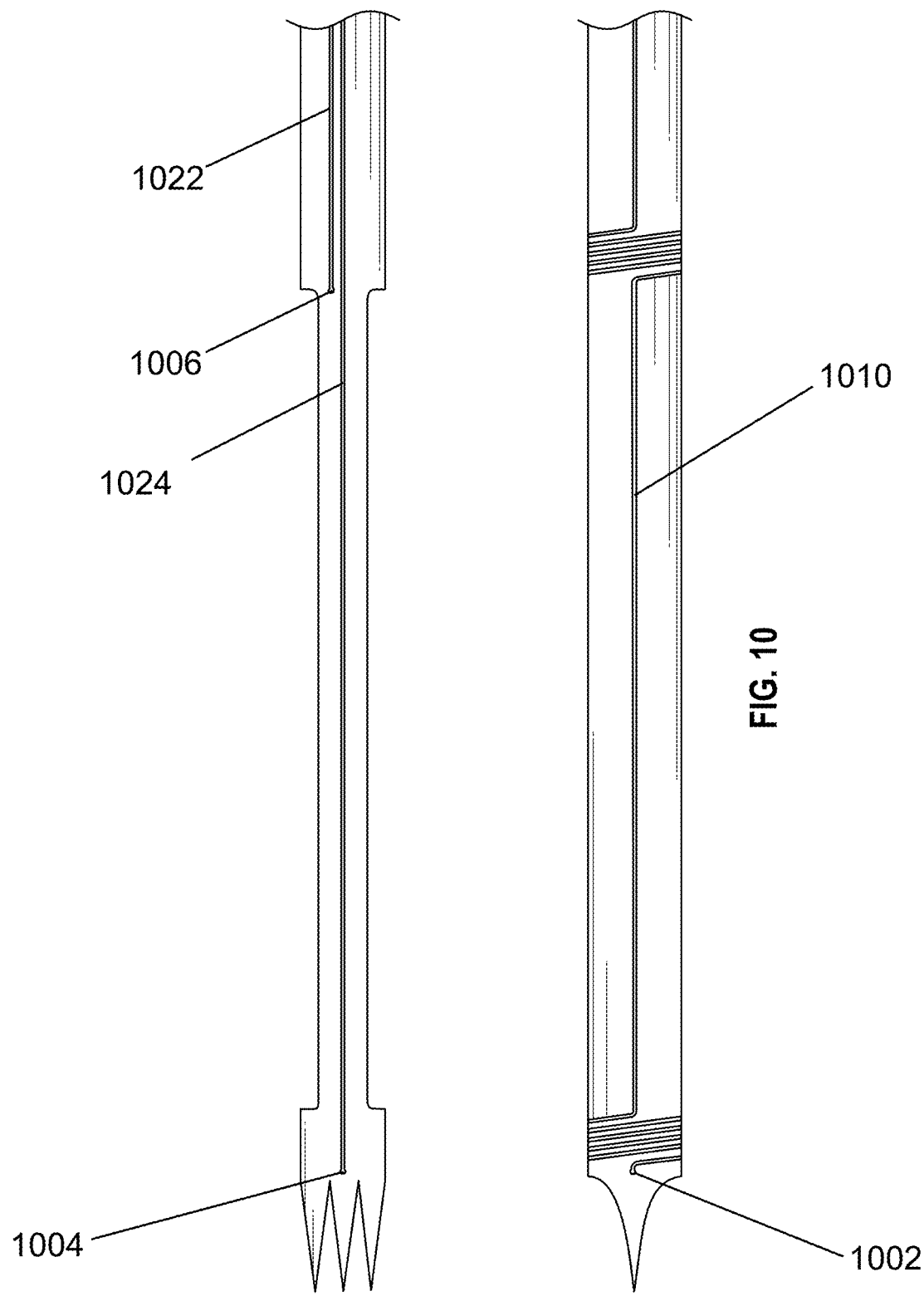
FIG. 10 and FIG. 11 depict an embodiment of a medical device having two relatively movable components that can be moved with respect to each other to complete a resonant circuit path.

A multiple antenna design (provided, for example, as multiple layers of conductors) can be applied to this type of coaxial biopsy needle. After an insulation layer is applied to both the inner and outer needles, radio-frequency ("RF") receiver coils and one or more transmission lines can be printed using conductive ink as set forth elsewhere herein and/or deposited in other manners. An illustrative example of such an example having RF loop coils and transmission line designed is shown in FIG. 10, wherein a first leg of a transmission line 1022, 1024 is printed on an outer surface of the inner, core needle, and a second transmission line 1010 is printed on an outer surface of the outer needle. At least two different resonant circuits can be formed (wherein a capacitor, not shown is inserted between the proximal ends of the transmission line, or a capacitor is otherwise formed in the printing process), wherein a first circuit is formed when the distal contact 1002 of the leg of the transmission line 1010 formed on the outer tubular member is in electrically coupled to the distal contact 1004 of the leg of the transmission line 1024 on the inner tubular member. A second resonant circuit is formed when the inner tubular member is advanced distally such that the contact 1006 if tge second conductive layer of the transmission line 1022 in position 2, as indicated in FIG. 10 and FIG. 11, is electrically coupled to the distal contact 1002 of the leg 1010 of the transmission line on the outer leg of the biopsy needle.

The RF receiver loop coil antennas are depicted as part of a first leg of a transmission line being wound or deposited around the outer needle at a distal location and at a proximal location, coupled by a length of conductor, and another conductor extends proximally from the conductors toward a proximal end of the biopsy needle. The second leg of the transmission line is printed or otherwise deposited on the core needle. The transmission line circuit can be completed by electrical coupling of the contacts at discrete locations. For example, a circuit can be completed through the wall of the outer tube to the inner tubular member through a conductive wall of the needle, or by laser drilling an opening through the wall of the outer tube at the contact point and depositing conductive ink into the opening or around the periphery of the opening.

Figure 11:
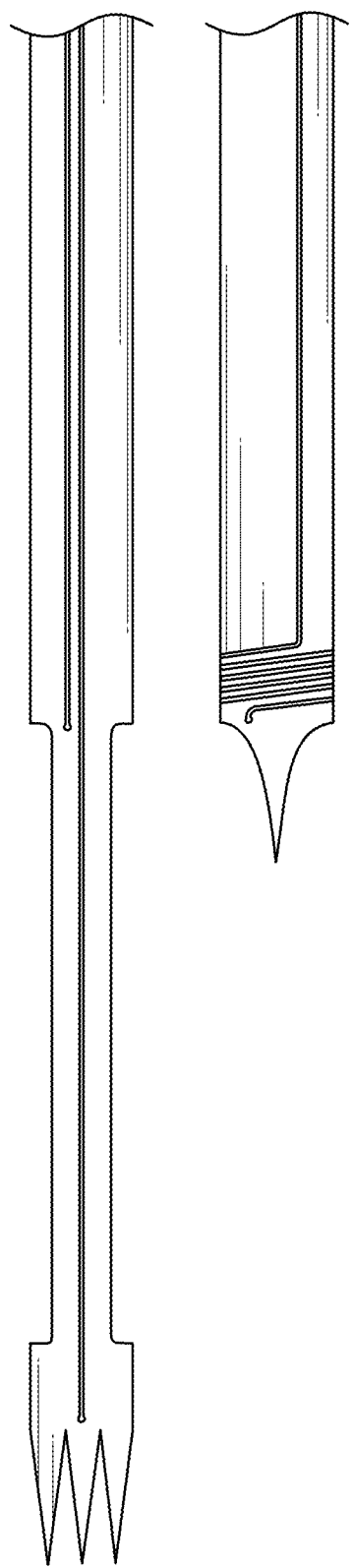

When the needle of FIG. 10 and FIG. 11 has reached a target location or targeted biopsy area, a biopsy actuator located at a proximal end of the needle is loaded by pulling the knob on the handle and the outer needle is pulled back while rotating a certain degree around its longitudinal axis to align the tip 1002 of the RF receiver loop coil antenna's tip to the second leg 1022 of the transmission line via contact 1006 and to expose the biopsy cavity of the core needle. The actuator can be released, causing the outer tube to snap distally over the tissue sample, separating it from the rest of the surrounding tissue. The shifting of the electrical connection point between the first and second layer of the RF receiver loop coils and transmission line design between before and after firing the gun permits a user to visualize the whole biopsy needle actively without any interruption both before and after the sample is taken. It will be appreciated that the biopsy needle can be configured for core needle biopsy (CNB) and vacuum-assisted biopsy (VAB) procedures. It will also be appreciated that, while the biopsy needle can be a hand held instrument it can also be attached to an actuator of a robotic surgical system.

Figure 16:
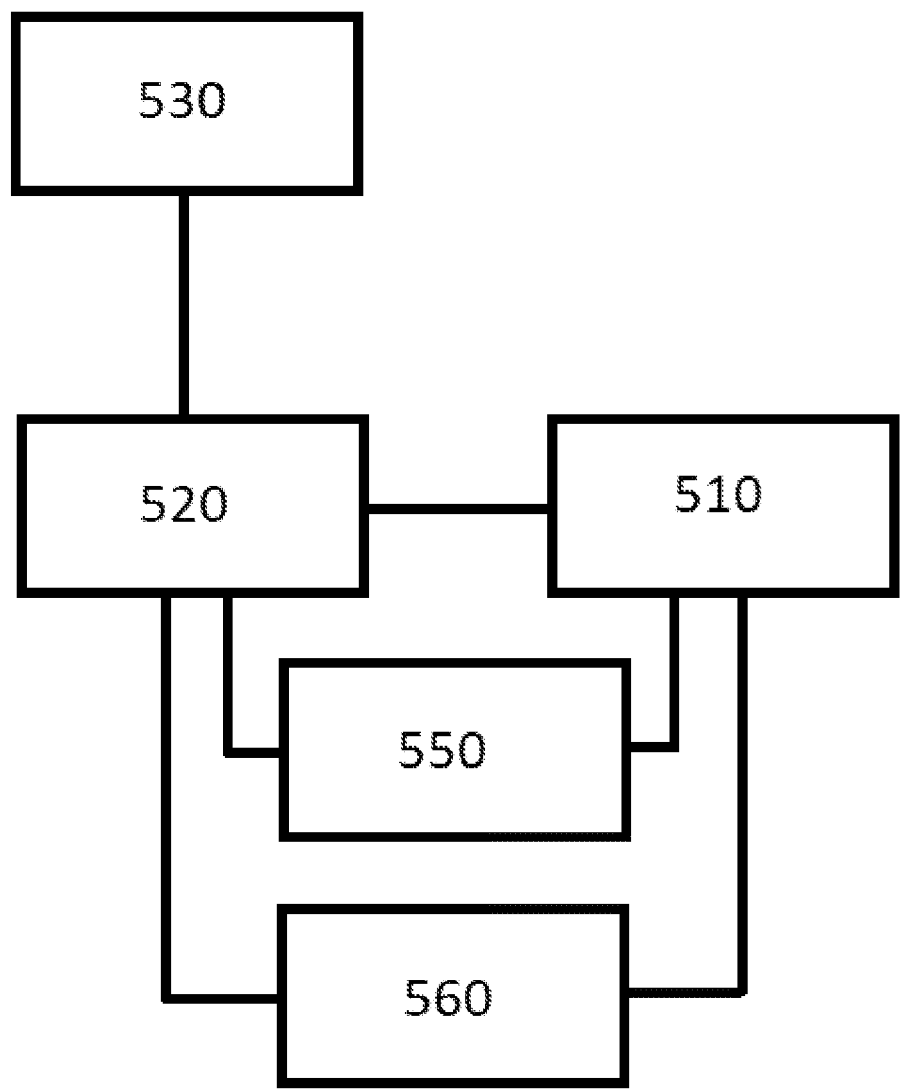

Moreover, it will be appreciated that this technique of forming transmission lines on different components of medical devices can apply to any medical device, such as a catheter having two or more discrete positions for components that can be moved with respect to each other. Thus, as presented in the schematic in FIG. 16, a catheter 500 with a retractable sheath 510 can be so configured wherein, for example, an outer retractable sheath 510 is withdrawn proximally to expose a stent 530 or other prosthesis in situ at a target location. The device can thus be an active MRI device that is visible with the sheath 510 in a distal position, wherein a circuit is completed through the sheath (e.g., by way of conductive braiding passing through the sheath and/or printed circuits) and into a core member or inner member 520 of the catheter that can have a transmission line printed on its outer surface that extends proximally to the proximal end of the device, as with the illustrated biopsy needle. When withdrawn (and rotated, if desired) to a proximal position, a contact at the distal end, or other location, of the sheath can complete or form one or more resonant circuits 550, 560 with a second conductor formed on the inner member of the catheter as with the embodiment of FIG. 10 and FIG. 11. A handle or proximal actuator can include an actuator for withdrawing the sheath proximally, and if desired, also rotating the sheath as it is withdrawn to permit the conductive leg of the transmission line on the sheath on the sheath to contact one or more discrete conductors formed on the core or inner member of the catheter that the sheath is sliding over. This can be useful, for example, in a catheter having a plurality of stents or other prostheses disposed thereon, wherein a resonant circuit can be formed when the sheath (i) is closed and in a first, distal position, (ii) when the sheath has withdrawn proximally sufficiently to permit a first prosthesis to be exposed and deployed (e.g. self-expanded or balloon expanded) in a second, intermediate position, (iii) when the sheath is still further withdrawn proximally to a third position exposing a second prosthesis to permit the second prosthesis to be deployed, and so on to a fourth, fifth, or sixth position to deploy third, fourth and fifth prostheses, for example.

Figure 12:
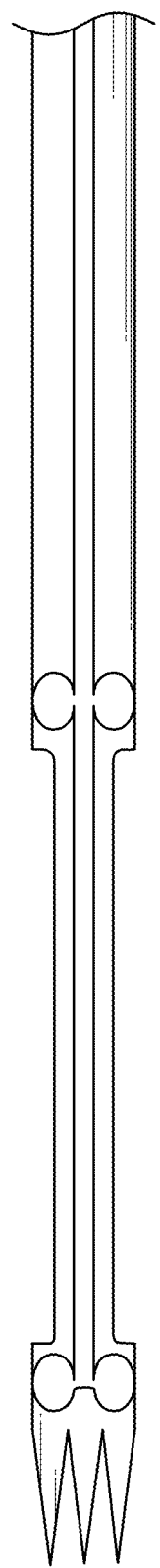
FIG. 12 presents an alternative conductor arrangement with respect to the embodiment of FIG. 10 and FIG. 11.

In accordance with a further implementation, as illustrated in FIG. 12, instead of solenoid coils as depicted in FIG. 10 and FIG. 11, printing saddle coils (e.g., oval coils) allows to print both RF receiver marker coils and their associated transmission line in a single layer for device visualization under MRI. It will be further appreciated that these embodiments can be modified by applying these techniques to form transmission lines to different types of coaxial devices such as breast, liver or prostate biopsy needles. Each component of the respective coaxial needle device can have a specific part of the overall circuit design, and the circuit can be completed when the connection pad of each layer is aligned. The radial and longitudinal position of the outer needle can be changed through the handle (or robotic actuator, as appropriate) so this feature allows to switch between two or more different circuit designs when needed. Printing different circuits on each layer using conductive ink with contact pads on each component of coaxial structures can allow to switch between different circuit options such as matching/detuning circuits, a transmission line for a temperature sensor (i.e. thermistor) or transmission line for an RF ablation probe. Thus, the printing techniques can permit printing different circuits that, when completed, can carry out a desired diagnostic and/or therapeutic function.

Thus, the device having two or more selectable states as set forth above that can complete two or more electrical circuits by modifying alignment of two or more portions of the device can include a needle, a catheter, a device delivery catheter, a guidewire, an ablation guidewire, an endoscope, a flexible catheter, an implant, a shunt, a stent, a pacemaker, and a pacemaker lead, or a portion thereof, among others. The iMRI device can be an orthopedic medical device such as a spinal rod, a pedicle screw, a bone plate, a pin, an interbody fusion device, or a portion thereof, and the like. The iMRI device can be a diagnostic medical device such as a biopsy needle, a probe, a dye introduction catheter, or a portion thereof, and the like. In some implementations, the iMRI device can be a laparoscopic surgical device such as an endoscope, an electrosurgical cutting instrument, an ultrasonic dissector, a surgical mesh, or a portion thereof, and the like. In some embodiments, the iMRI device can be a gynecological medical device such as a uterine manipulator, a tissue dissector, a probe, an electrocautery device, or a portion thereof, and the like. If desired, the iMRI device can be a therapeutic medical device such as an implant, a neuromodulation device, a patch, or a portion thereof and the like.

Figure 13:
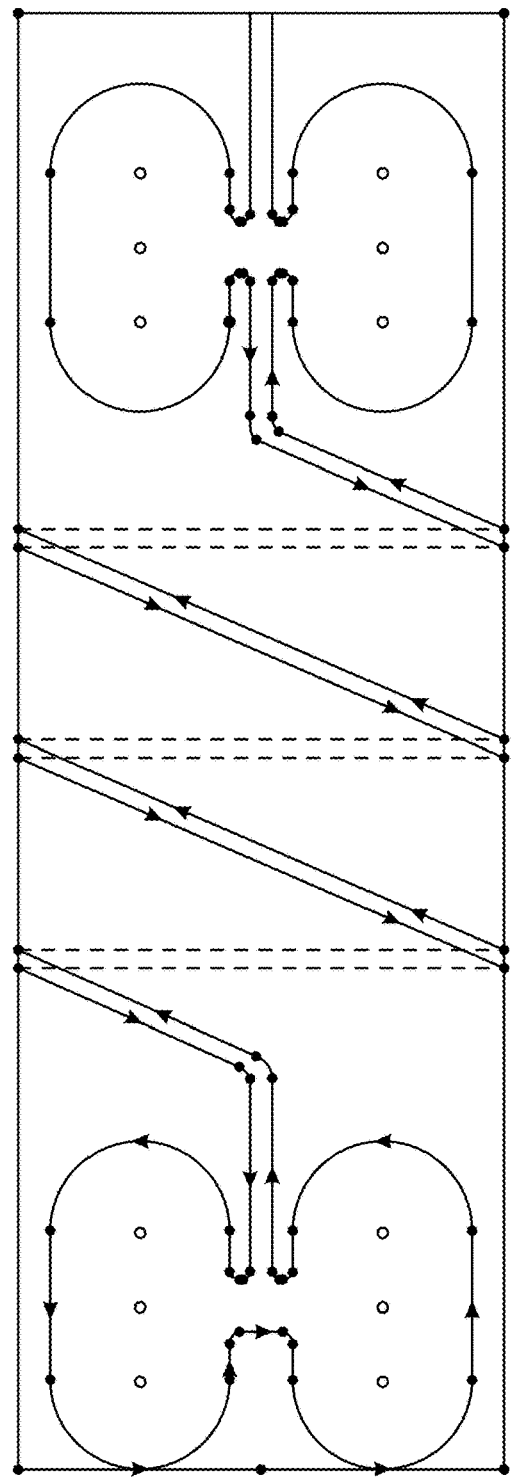
FIG. 13 illustrates a close up view of a distal portion of saddle coil markers printed on the distal tip of an interventional device.
Figure 14:
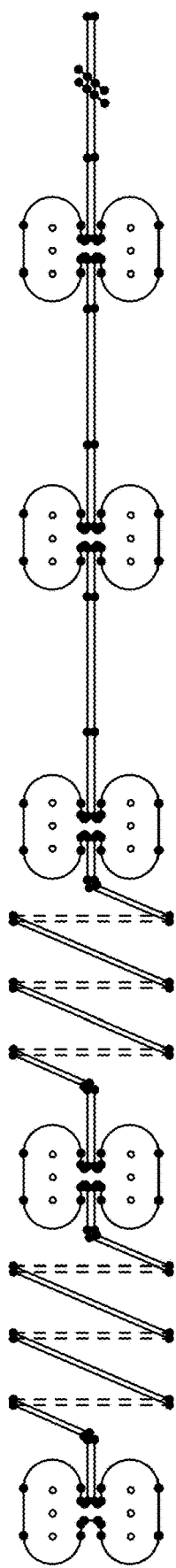
FIG. 14 illustrates a flattened version of saddle marker coils and a transmission line printed over the shaft of an interventional device using conductive ink.
Figure 15:
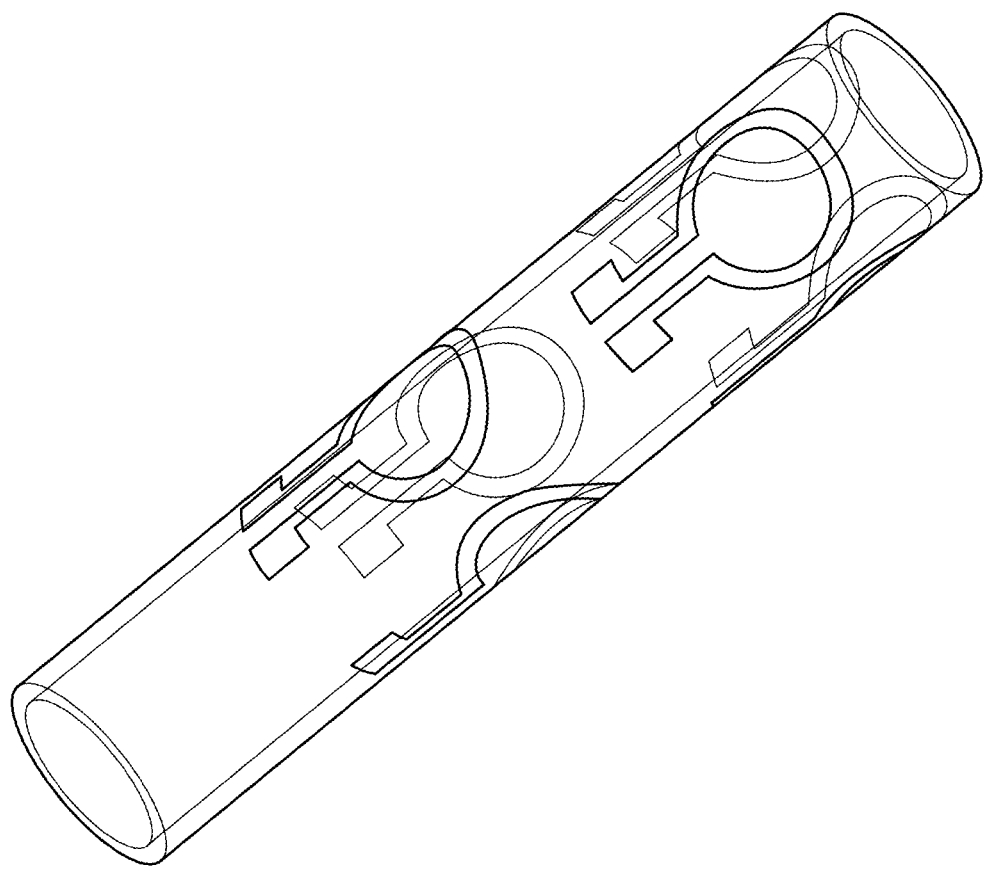
FIG. 15 illustrates semi active markers tuned to a local Larmour frequency printed over an interventional device to visualize the device wirelessly.

FIGS. 13-15 present additional illustrative embodiments in accordance with the present disclosure. RF receiver or transmit antenna geometries can be optimized through electromagnetic simulations to maximize the signal-to-noise ratio (SNR) of the device signal (for a RF receiver antenna) or signal-to-noise ratio (SNR) of anatomical images (for a transmit antenna) based on a targeted clinical application. Such embodiments can be formed using the disclosed printing methods, or other disclosed techniques, as appropriate.

For example, in some implementations, one can form one or more distinct active visualization markers on interventional devices that allows physicians to measure the insertion depth precisely during a procedure by counting a number of active markers located with certain intervals along the device.

FIG. 13 illustrates a magnified distal portion of saddle coil markers printed on a distal tip of an interventional device. As presented, FIG. 13 illustrates an unwrapped, or flattened, schematic that can be printed, for example, onto a cylindrical or other three dimensional surface, such as a tube or solid member with a non-circular cross section, or other instrument, for example, to form a RF receiver antenna design printed on the distal end of a biopsy needle, or other instrument, as appropriate. The transmission line that connects the two saddle coils is printed in the form of opposing solenoid coils. The arrows show the induced directions of electrical current over the printed antenna as a snapshot. The magnetic field lines parallel to the solenoid axis cancel each other due to the reverse induced currents along the solenoid transmission line and creates a signal void between two saddle active marker coils. FIG. 14 presents a similarly "unwrapped" or flattened schematic that can be printed about a cylinder or other three dimensional shape presenting saddle marker coils and a transmission line printed over the cylindrical or other shaped shaft of an interventional device using conductive ink. A parallel line pair transmission line can be used between saddle coils instead of an opposed solenoid coil when it is desired to visualize the device shaft continuously.

FIG. 15 presents an illustrative example of a RF receiver antenna design printed on a tip of a biopsy needle or other structure. In this illustration, the critical length on the distal portion can be visualized differently than the rest of the needle shaft. The embodiment of FIG. 15 includes semi-active markers, which can be formed on a single layer or on multiple layers of material, or formed in a single layer, or multiple layers of deposited material (e.g., via printing or other technique) of metamaterials and/or a self-resonant LC tank circuit that is tuned to the local Larmour frequency, which refers to the rate of precession of the magnetic moment of the proton around the external magnetic field, B0. The frequency of precession is thus related to the strength of the magnetic field, B0. These markers, wherein the illustrated shape is only intended as an example, can be designed digitally using suitable electromagnetic simulation software in any desired shape and then printed automatically over the interventional devices using conductive ink, in some implementations, to visualize them under real time MRI. In this case, the amplified magnetic field over the semi-active markers couple with external surface coils wirelessly to visualize the interventional MRI device during MR guided interventional procedures. The semi active markers can be printed on the device shaft with rotary offset to make sure sufficient coupling in different orientations of the device relative to the main magnetic field of the MRI scanner. For example, the self resonant marker geometry can have a resonant frequency equal to the Larmour frequency corresponding to 0.55 T, 1.5 T or 3.0 T MRI scanners. Multiple self resonant markers tuned to different Larmour frequencies (i.e. 1.5 T and 3.0 T) can be printed on a single medical device to make it visible in different magnetic field strengths. Thus, as illustrated in FIG. 15, semi active markers tuned to the Larmour frequency can be printed over the interventional device to visualize the device wirelessly.

The aforementioned embodiments of the iMRI devices of FIGS. 13-15 can include, for example, a needle, a catheter, a device delivery catheter, a guidewire, an ablation guidewire, an endoscope, a flexible catheter, an implant, a shunt, a stent, a pacemaker, and a pacemaker lead, or a portion thereof, among others. The iMRI device can be an orthopedic medical device such as a spinal rod, a pedicle screw, a bone plate, a pin, an interbody fusion device, or a portion thereof, and the like. The iMRI device can be a diagnostic medical device such as a biopsy needle, a probe, a dye introduction catheter, or a portion thereof, and the like. In some implementations, the iMRI device can be a laparoscopic surgical device such as an endoscope, an electrosurgical cutting instrument, an ultrasonic dissector, a surgical mesh, or a portion thereof, and the like. In some embodiments, the iMRI device can be a gynecological medical device such as a uterine manipulator, a tissue dissector, a probe, an electrocautery device, or a portion thereof, and the like. If desired, the iMRI device can be a therapeutic medical device such as an implant, a neuromodulation device, a patch, or a portion thereof and the like.

The advantages and features of the application are of a representative sample of embodiments only, and are not exhaustive and/or exclusive. They are presented only to assist in understanding and teach the claimed principles. It should be understood that they are not representative of all disclosed embodiments. As such, certain aspects of the disclosure have not been discussed herein. That alternate embodiments may not have been presented for a specific portion of the disclosure or that further undescribed alternate embodiments may be available for a portion is not to be considered a disclaimer of those alternate embodiments. It will be appreciated that many of those undescribed embodiments incorporate the same principles of the disclosure and others are equivalent. Thus, it is to be understood that other embodiments may be utilized and functional, logical, organizational, structural and/or topological modifications may be made without departing from the scope and/or spirit of the disclosure. As such, all examples and/or embodiments are deemed to be non-limiting throughout this disclosure. Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure. Furthermore, it is to be understood that such features are not limited to serial execution, but rather, any number of threads, processes, services, servers, and/or the like that may execute asynchronously, concurrently, in parallel, simultaneously, synchronously, and/or the like are contemplated by the disclosure. As such, some of these features may be mutually contradictory, in that they cannot be simultaneously present in a single embodiment. Similarly, some features are applicable to one aspect of the disclosure, and inapplicable to others. In addition, the disclosure includes other embodiments not presently claimed. Applicant reserves all rights in those presently unclaimed embodiments including the right to claim such embodiments, file additional applications, continuations, continuations in part, divisions, and/or the like thereof. As such, it should be understood that advantages, embodiments, examples, functional, features, logical, organizational, structural, topological, and/or other aspects of the disclosure are not to be considered limitations on the disclosure as defined by the claims or limitations on equivalents to the claims.

All statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Descriptions herein of circuitry and method steps and computer programs represent conceptual embodiments of illustrative circuitry and software embodying the principles of the disclosed embodiments. Thus the functions of the various elements shown and described herein may be provided through the use of dedicated hardware as well as hardware capable of executing software in association with appropriate software as set forth herein.

In the disclosure hereof any element expressed as a means for performing a specified function is intended to encompass any way of performing that function including, for example, a) a combination of circuit elements and associated hardware which perform that function or b) software in any form, including, therefore, firmware, microcode or the like as set forth herein, combined with appropriate circuitry for executing that software to perform the function. Applicants thus regard any means which can provide those functionalities as equivalent to those shown herein.

Similarly, it will be appreciated that the system and process flows described herein represent various processes which may be substantially represented in computer-readable media and so executed by a computer or processor, whether or not such computer or processor is explicitly shown. Moreover, the various processes can be understood as representing not only processing and/or other functions but, alternatively, as blocks of program code that carry out such processing or functions.

The methods, systems, computer programs and mobile devices of the present disclosure, as described above and shown in the drawings, among other things, provide for improved magnetic resonance methods, systems and machine readable programs for carrying out the same. It will be apparent to those skilled in the art that various modifications and variations can be made in the devices, methods, software programs and mobile devices of the present disclosure without departing from the spirit or scope of the disclosure. Thus, it is intended that the present disclosure include modifications and variations that are within the scope of the subject disclosure and equivalents.

What is claimed is:

1. A system for performing medical imaging of a medical device in a MR scanner, comprising:
    a magnetic resonance device including (i) a main magnet for providing a background magnetic field along a first direction, (ii) at least one radio-frequency coil, and (iii)) at least one gradient coil that can be controlled to define a region of interest and
    a medical device having MRI-compatible circuitry, comprising:
    a first, outer elongate tubular body including a first electrical circuit; and
    a second elongate body including a second electrical circuit, the second elongate body being movably disposed within the outer elongate tubular body; and
    wherein relative movement of the second elongate body with respect to the outer elongate tubular body from a first relative position to a second relative position results in temporary formation of a resonant circuit composed of the first circuit and the second circuit, the resonant circuit being configured to interact with an excitation field during magnetic resonance imaging by emitting a signal in response to RF excitation by the magnetic resonance device, the signal being detected by the at least one radio frequency coil of the magnetic resonance device and routed through a digital receiver of the magnetic resonance device.

2. The system of claim 1, wherein the medical device includes a biopsy needle, wherein, when aligned in the second relative position, a window in the outer elongate body aligns with a compartment defined in the second elongate body to facilitate collection of a tissue sample.

3. The system of claim 2, wherein, when aligned in the second relative position, visibility under MRI of a portion of the medical device proximate the window in the outer elongate body is enhanced by completion of the electrical circuit.

4. The system of claim 1, wherein the second elongate body can be moved longitudinally and rotationally with respect to the outer elongate tubular body.

5. The system of claim 1, wherein each of the second elongate body and outer elongate tubular body defines thereon, respectively, a first layer of electrically insulating material, and a second layer of electrically conducting material deposited over the first layer of electrically insulating material.

6. The system of claim 5, wherein the electrical circuitry on at least one of the second elongate body and outer elongate tubular body includes transmission lines.

7. The system of claim 6, wherein the electrical circuitry on at least one of the second elongate body and outer elongate tubular body further includes RF loop coils.

8. The system of claim 7, wherein a first leg of a transmission line is formed on an outer surface of the second elongate body, and a second leg of the transmission line is formed on a surface of the outer elongate tubular body.

9. The system of claim 6, wherein the electrical circuitry on at least one of the second elongate body and outer elongate tubular body further includes at least one capacitor.

10. The system of claim 6, wherein the electrical circuitry on at least one of the second elongate body and outer elongate tubular body further includes RF saddle coils.

11. The system of claim 10, wherein the RF saddle coils and a transmission line coupled thereto are formed by a single layer of conductive material.

12. The system of claim 1, wherein, when in the first relative position, a first resonant circuit is temporarily formed and, further wherein, when in the second relative position, a second, different resonant circuit is temporarily formed.

13. The system of claim 1, wherein the medical device is a catheter that permits two or more discrete relative positions of the outer elongate tubular body and the second elongate body.

14. The system of claim 13, wherein the outer elongate tubular body forms a retractable sheath to be retracted proximally to expose a prosthesis mounted on the second elongate body at a target location, wherein the second elongate body forms an inner member of the catheter.

15. The system of claim 14, wherein the medical device is an active MRI device that is visible under MRI with the sheath in a distal position, wherein the resonant circuit is completed through the sheath and into the inner member of the catheter having a transmission line formed on its outer surface that extends toward a proximal end of the medical device, the resonant circuit being configured to interact with the excitation field during magnetic resonance imaging by emitting the signal in response to RF excitation by the magnetic resonance device, the signal being detected by the at least one radio frequency coil of the magnetic resonance device and routed through the digital receiver of the magnetic resonance device, wherein the at least one radio frequency coil is a separate component from the medical device.

16. The system of claim 15, wherein when the sheath is withdrawn to a proximal position, an electrical contact formed on the sheath can complete a circuit with a second conductor formed on an inner member of the catheter.

17. The system of claim 14, wherein the catheter includes at least one stent disposed underneath the sheath.

18. The system of claim 14, wherein the catheter includes a plurality of prostheses disposed underneath the sheath, and further wherein (i) a first resonant circuit is formed when the sheath is closed and in a first, distal position, (ii) a second resonant circuit is formed when the sheath has withdrawn to permit a first prosthesis to be exposed and deployed.

* * * * *